(12) United States Patent
Liu et al.

(10) Patent No.: US 12,317,564 B2
(45) Date of Patent: May 27, 2025

(54) GALLIUM NITRIDE-BASED COMPOUND SEMICONDUCTOR DEVICE

(71) Applicant: XIAMEN SANAN INTEGRATED CIRCUIT CO., LTD., Xiamen (CN)

(72) Inventors: Shenghou Liu, Xiamen (CN); Wenbi Cai, Xiamen (CN)

(73) Assignee: XIAMEN SANAN INTEGRATED CIRCUIT CO., LTD., Xiamen (CN)

( * ) Notice: Subject to any disclaimer, the term of this patent is extended or adjusted under 35 U.S.C. 154(b) by 498 days.

(21) Appl. No.: 17/893,594

(22) Filed: Aug. 23, 2022

(65) Prior Publication Data

US 2022/0406898 A1 Dec. 22, 2022

Related U.S. Application Data

(63) Continuation-in-part of application No. 16/947,553, filed on Aug. 6, 2020, now abandoned, which is a continuation-in-part of application No. PCT/CN2019/073931, filed on Jan. 30, 2019.

(30) Foreign Application Priority Data

Feb. 11, 2018 (CN) .......................... 201810142648.0

(51) Int. Cl.
| | | |
|---|---|---|
| *H10D 62/85* | (2025.01) | |
| *H01L 21/24* | (2006.01) | |
| *H01L 21/285* | (2006.01) | |
| *H10D 64/62* | (2025.01) | |

(52) U.S. Cl.
CPC ....... *H10D 62/8503* (2025.01); *H01L 21/246* (2013.01); *H01L 21/28575* (2013.01); *H10D 62/85* (2025.01); *H10D 64/62* (2025.01)

(58) Field of Classification Search
CPC .... H10D 62/8503; H10D 62/85; H10D 64/62; H01L 21/246; H01L 21/28575
See application file for complete search history.

(56) References Cited

U.S. PATENT DOCUMENTS

| | | | |
|---|---|---|---|
| 2016/0218262 A1* | 7/2016 | Aketa | ..................... H01L 24/14 |
| 2017/0170364 A1* | 6/2017 | Jeon | ..................... H10H 20/841 |
| 2020/0365705 A1* | 11/2020 | Liu | ..................... H01L 21/246 |

* cited by examiner

*Primary Examiner* — Richard A Booth
(74) *Attorney, Agent, or Firm* — MUNCY, GEISSLER, OLDS & LOWE, P.C.

(57) ABSTRACT

A GaN-based compound semiconductor device includes a GaN-based epitaxial structure and an annealed metal layered structure that is formed on the GaN-based epitaxial structure. The annealed metal layered structure includes a metallic barrier layer, a conductive unit, and a protective unit which is formed on a lateral surface of the conductive unit. The metallic barrier layer and the conductive unit are sequentially disposed on the GaN-based epitaxial structure in such order. An ohmic contact is formed between the GaN-based epitaxial structure and the annealed metal layered structure. The protective unit includes a metal oxide material having one of NiAlO, AuAlO, and a combination thereof.

8 Claims, 3 Drawing Sheets

GALLIUM NITRIDE-BASED COMPOUND SEMICONDUCTOR DEVICE

CROSS-REFERENCE TO RELATED APPLICATION

This application is a continuation-in-part application of U.S. patent application Ser. No. 16/947,553 filed on Aug. 6, 2020, which is a bypass continuation-in-part application of PCT International Application No. PCT/CN2019/073931 filed on Jan. 30, 2019 that claims priority of Chinese Invention Patent Application No. 201810142648.0, filed on Feb. 11, 2018. The entire content of each of the U.S., international and Chinese patent applications is incorporated herein by reference.

FIELD

The present disclosure relates to a gallium nitride (GaN)-based compound semiconductor device.

BACKGROUND

Gallium nitride (GaN) is a third-generation semiconductor material having advantageous properties, such as a wide band gap of 3.4 eV, a high electron saturation velocity of $2 \times 10^7$ cm/s, a high dislocation density ranging from $1 \times 10^{10}$ V/cm to $3 \times 10^{10}$ V/cm, great thermal conductivity, anti-corrosive ability, and radiation resistance, and thus has been widely studied due to the prospect of broad applications. In particular, high-electron-mobility transistors (HEMT) including AlGaN/GaN heterostructures, which exhibit excellent performances (such as high frequency, high power density and high operating temperature), have been actively developed for solid-state microwave devices in power electronics.

The process of forming an ohmic contact is one of the key technologies in the manufacturing of GaN-based semiconductor devices, and directly affects the performance of such devices in terms of power, frequency, and reliability. A GaN-based material, which has a high thermal stability, is not prone to chemical reactions, and hence formation of an ohmic contact thereon would be difficult. It is often required to use metallic materials having a relatively low potential barrier (such as titanium, aluminum, etc.) to conduct an alloying treatment with the GaN-based material at a high temperature (such as higher than 800° C.), so as to form the ohmic contact. However, the alloying treatment conducted at such high temperature would cause aluminum having a low melting point to be molten and diffuse outwardly. The molten aluminum might be oxidized under a high temperature and be deposited on the surface of the epitaxial structure of the GaN-based semiconductor devices, adversely changing the surface state thereof and thereby adversely affecting the performance of the semiconductor devices.

It has been reported that a silicon nitride dielectric layer grown at a high temperature as a sidewall barrier is useful to prevent the diffusion of aluminum, so as to protect the surface of the epitaxial structure and effectively reduce interfacial contamination of Al and interface state between the metallic materials and the GaN-based material. However, growth of the silicon nitride dielectric layer requires additional equipments, and an etching process is required to be further conducted on the silicon nitride dielectric layer to form vias thereon, which not only cause the manufacturing process of the GaN-based semiconductor devices to become complicated, but also incur a high manufacturing cost.

SUMMARY

Therefore, an object of the present disclosure is to provide a gallium nitride (GaN)-based compound semiconductor device that can alleviate at least one of the drawbacks of the prior art.

According to the present disclosure, the GaN-based compound semiconductor device includes a GaN-based epitaxial structure and an annealed metal layered structure that is formed on the GaN-based epitaxial structure. The annealed metal layered structure includes a metallic barrier layer, a conductive unit, and a protective unit which is formed on a lateral surface of the conductive unit. The metallic barrier layer and the conductive unit are sequentially disposed on the GaN-based epitaxial structure in such order. An ohmic contact is formed between the GaN-based epitaxial structure and the annealed metal layered structure. The protective unit includes a metal oxide material having one of NiAlO, AuAlO, and a combination thereof.

BRIEF DESCRIPTION OF THE DRAWINGS

Other features and advantages of the present disclosure will become apparent in the following detailed description of the embodiments with reference to the accompanying drawings, of which.

DETAILED DESCRIPTION

Figure 1:
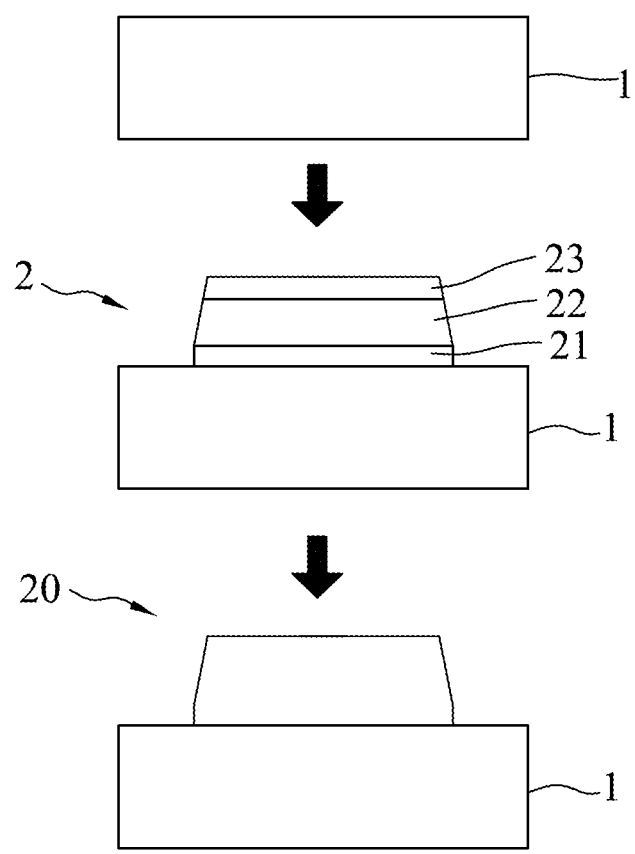
FIG. 1 is a schematic view illustrating consecutive steps of an embodiment of a method of forming an ohmic contact for a gallium nitride (GaN)-based compound semiconductor device according to the present disclosure.

Before the present disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, an embodiment of a method of forming an ohmic contact for a gallium nitride (GaN)-based compound semiconductor device according to the present disclosure includes steps (a) to (c).

In step (a), a metal layered structure 2 is formed on a GaN-based epitaxial structure 1. The metal layered structure 2 includes a diffusion barrier layer 21, an aluminum (Al) layer 22, and a metallic unit 23 which are sequentially disposed on the GaN-based epitaxial structure 1 in such order.

The diffusion barrier layer 21 may be made of Ti, and may have a thickness ranging from 10 nm to 30 nm. The Al layer 22 may have a thickness ranging from 100 nm to 200 nm. The metallic unit 23 may include at least one metallic layer. Examples of the metallic layer may include, but are not limited to, a Ni layer, an Au layer, a Ti layer, a Pd layer, a Pt layer, a Mo layer, and a TiN layer. For instance, the metallic unit 23 may include the TiN layer. For another instance, the metallic unit 23 may include multiple metallic layers such as Ni/Au layers, Ti/Au layers, Pd/Au layers, Pt/Au layers, or Mo/Au layers. Each layer of the metal layered structure 2 may be formed by a metal evaporation process or a sputtering process. The resultant metal layered structure 2 may be further subjected to a lift off process to form a predetermined pattern.

In step (b), the metal layered structure 2 is subjected to an oxidation treatment in an oxygen atmosphere at a first temperature ranging from 350° C. to 650° C. for a first time period ranging from 30 seconds to 240 seconds, so as to obtain the oxidized metal layered structure 2 including an aluminum oxide (AlO) layer 24 that is formed on a lateral surface of the Al layer 22. In other words, the oxidized metal layered structure 2 includes the diffusion barrier layer 21, the Al layer 22, the metallic unit 23, and the AlO layer 24 formed on the lateral surface of the Al layer 22.

The first temperature and the first time period may be adjusted according to the oxidation degree of the metal layered structure 2 to be achieved. For example, the first temperature may range from 400° C. to 600° C., and the first time period may range from 50 seconds to 150 seconds.

In this embodiment, step (b) includes sub-steps (b1) and (b2). In sub-step (b1), the metal layered structure 2 is heated from a room temperature (about 20° C. to 30° C.) to the first temperature within 30 seconds to 180 seconds, followed by maintaining the first temperature for the first time period to conduct the oxidation treatment. In sub-step (b2), the oxidized metal layered structure 2 is cooled from the first temperature to less than 50° C. Examples of a process for cooling the oxidized metal layered structure 2 may include, but are not limited to, a water cooling process, an air cooling process, a natural cooling process, and combinations thereof.

In step (c), the oxidized metal layered structure 2 and the GaN-based epitaxial structure 1 are subjected to an alloying treatment in a nitrogen atmosphere at a second temperature that is higher than the first temperature so as to form the ohmic contact therebetween.

The alloying treatment may be conducted at the second temperature that ranges from 700° C. to 900° C. for a second time period that ranges from 20 seconds to 60 seconds. The alloying treatment may be conducted using a rapid thermal annealing process.

The second temperature and the second time period of the alloying treatment may be predetermined based on a minimum resistivity of the thus formed ohmic contact to be achieved. Due to the formation of the AlO layer 24 on the lateral surface of the Al layer 22, molten aluminum can be effectively prevented from being diffused to and deposited on a surface of the GaN-based epitaxial structure 1 during the alloying treatment, thereby improving the reliability of the GaN-based compound semiconductor device.

According to the present disclosure, during the alloying treatment, a change in the arrangement of atoms of the oxidized metal layered structure 2 may occur so as to obtain an annealed metal layered structure 20 (to be described hereinafter) that is formed on the GaN-based epitaxial structure 1.

Figure 3:
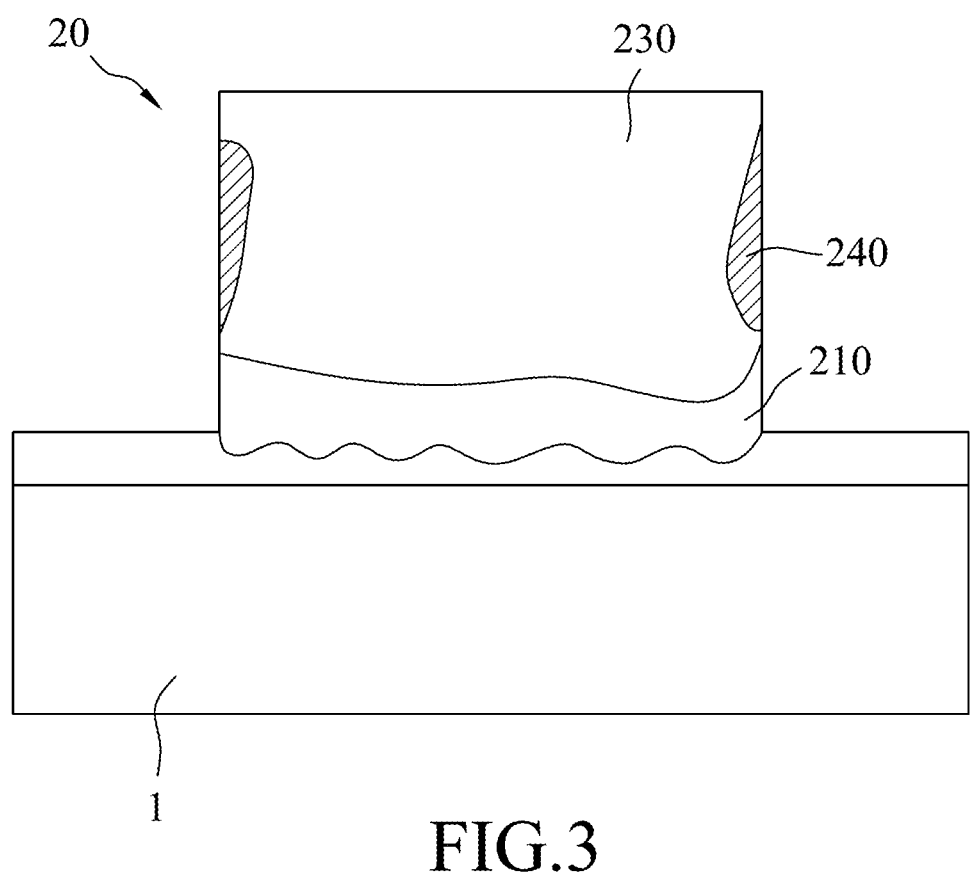
FIG. 3 is a schematic view illustrating the GaN-based compound semiconductor device according to the present disclosure which is manufactured by the method.

The present disclosure also provides the GaN-based compound semiconductor device, which may be manufactured by the abovementioned steps (a), (b) and (c). The GaN-based compound semiconductor device includes the GaN-based epitaxial structure 1 and the annealed metal layered structure 20 formed on the GaN-based epitaxial structure 1. Referring to FIG. 3, the annealed metal layered structure 20 includes a metallic barrier layer 210, a conductive unit 230, and a protective unit 240. The metallic barrier layer 210 and the conductive unit 230 are sequentially disposed on the GaN-based epitaxial structure 1 in such order, and the protective unit 240 is formed on a lateral surface of the conductive unit 230. An ohmic contact is formed between the GaN-based epitaxial structure 1 and the annealed metal layered structure 20.

In this embodiment, the metallic unit 23 of the metal layered structure 2 may include a Ni layer and an Au layer which are sequentially disposed on the Al layer 22 in such order.

It should be noted that, during the alloying treatment, the Au atoms in the Au layer of the metallic unit 23 may diffuse through the Ni layer to reach the Al layer 22, so as to form AlAu. During the alloying treatment, the AlO layer 24 may prevent the molten Al layer 22 from flowing onto the surface of the GaN-based epitaxial structure 1. Moreover, since the AlAu layer may affect the flatness of the surfaces of the conductive unit 230 due to the high mobility of Al, the AlO layer 24 may be utilized as a blocking layer, thereby preventing the conductive unit 230 from having irregular surfaces. Furthermore, the AlO layer 24 may be reacted with Au diffused from the Au layer to form the protective unit 240, and diffusion of the Au atoms at the lateral surface of the conductive unit 230 may be prevented. The protective unit 240 may include a metal oxide material having one of NiAlO, AuAlO, and a combination thereof. In addition to AlAu, due to the rearrangement of the atoms in the oxidized metal layered structure 2, the conductive unit 230 may contain AlNi, NiAu and/or AlAuNi, and may further include Au, Al and/or Ni. The metallic barrier layer 210 contains TiN.

In addition, after the alloying treatment, a dielectric layer including SiN or SiO may be formed on the surface of the annealed metal layered structure 20 to achieve a passivation effect or an electrical isolation effect. However, in an environment of high pressure and high temperature, Al may easily react with Si in the dielectric layer to form AlSi, which may cause electrical leakage or may even damage the device. By having the protective unit 240 formed on the lateral surface of the conductive unit 230, the dielectric layer is isolated from the conductive unit 230, which effectively prevents Al from reacting with Si, thereby improving reliability of the GaN-based compound semiconductor device.

Figure 2:
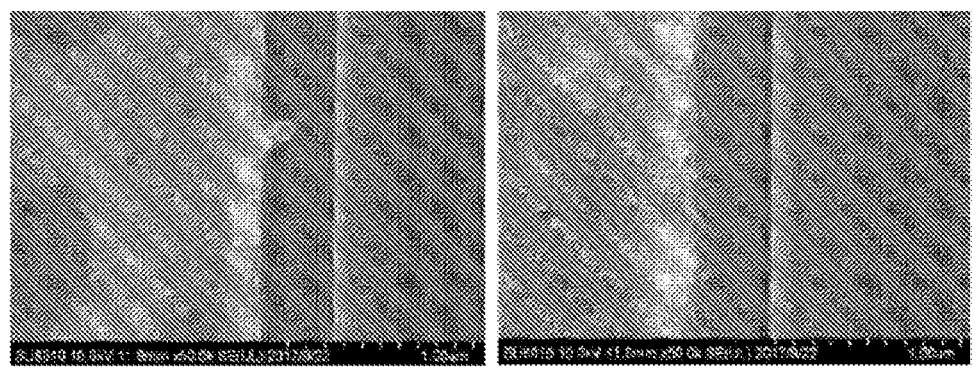
FIG. 2 are scanning electron microscopy images respectively showing the ohmic contact formed by the embodiment according to the present disclosure and that formed by a conventional method.

FIG. 2 shows scanning electron microscopy images of the ohmic contact formed by the method of the present disclosure (right panel) and that formed by a conventional method (left panel). The conventional method of forming an ohmic contact is different from the method of the present disclosure in that the oxidation treatment of the metal layered structure 2 (i.e., step (b)) is omitted. In the left panel, metal burrs are observed due to lateral diffusion of molten aluminum during the alloying treatment (namely, the conventional method cannot lead to formation of the AlO layer 24, which can block such diffusion, on the lateral surface of the Al layer 22). In contrast, in the right panel, metal burrs are clearly absent since the AlO layer 24 formed on the lateral surface of the Al layer 22 is capable of blocking the diffusion of Al. Therefore, the ohmic contact formed by the method of the present disclosure is expected to be suitable for fabricating source and drain metal electrodes of the GaN-based compound semiconductor device, so as to reduce the risk of tip discharge caused by metal burrs, thereby improving breakdown voltage of the GaN-based compound semiconductor device according to the present disclosure.

In summary, by virtue of forming the AlO layer 24 on the lateral surface of the Al layer 22 during the oxidation treatment, followed by forming the protective unit 240 on the lateral surface of the conductive unit 230 during the alloying treatment, the method of this disclosure is capable of preventing the problem of lateral diffusion of molten Al during the alloying treatment, so as to not only effectively reduce the risk of interfacial contamination of Al and change in the interface state between the GaN-based epitaxial structure 1 and the metal layered structure 2 and the interface state between the GaN-based epitaxial structure 1 and the annealed metal layered structure 20, but also simplify the manufacturing process and greatly save the manufacturing cost. In addition, the GaN-based compound semiconductor device having the ohmic contact formed thereby without metal burrs can exhibit non-interfered electrical properties, possessing satisfactory reliability.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the present disclosure has been described in connection with what is considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A gallium nitride (GaN)-based compound semiconductor device, comprising:
    a GaN-based epitaxial structure; and
    an annealed metal layered structure that is formed on said GaN-based epitaxial structure, and that includes a metallic barrier layer, a conductive unit and a protective unit which is formed on a lateral surface of said conductive unit, said metallic barrier layer and said conductive unit being sequentially disposed on said GaN-based epitaxial structure in such order, an ohmic contact being formed between said GaN-based epitaxial structure and said annealed metal layered structure,
    wherein said protective unit includes a metal oxide material having one of NiAlO, AuAlO, and a combination thereof.

2. The GaN-based compound semiconductor device as claimed in claim 1, wherein said conductive unit contains at least one of AlNi, NiAu, AuAl, or AuAlNi.

3. The GaN-based compound semiconductor device as claimed in claim 2, wherein said conductive unit further includes at least one of Au, Al or Ni.

4. The GaN-based compound semiconductor device as claimed in claim 3, wherein said annealed metal layered structure is obtained by subjecting a metal layered structure to an oxidation treatment to form an oxidized metal layered structure, and then subjecting said oxidized metal layered structure to an alloying treatment.

5. The GaN-based compound semiconductor device as claimed in claim 4, wherein said metal layered structure includes a diffusion barrier layer, an Al layer, and a metallic unit which are sequentially disposed on said GaN-based epitaxial structure in such order, said oxidized metal layered structure includes said diffusion barrier layer, said Al layer, said metallic unit and an AlO layer which is formed on a lateral surface of said Al layer.

6. The GaN-based compound semiconductor device as claimed in claim 5, wherein said metallic unit includes a Ni layer and an Au layer which are sequentially disposed on said Al layer in such order.

7. The GaN-based compound semiconductor device as claimed in claim 6, wherein said diffusion barrier layer has a thickness ranging from 10 nm to 30 nm.

8. The GaN-based compound semiconductor device as claimed in claim 1, wherein said metallic barrier layer contains TiN.

* * * * *